United States Patent
Slamecka

(10) Patent No.: US 7,095,236 B2
(45) Date of Patent: Aug. 22, 2006

(54) SYNTHETIC EQUIVALENCE TEST CIRCUIT FOR CIRCUIT BREAKER TESTING

(76) Inventor: Ernst Slamecka, Alt-Pichelsdorf 13, Berlin D-13595 (DE)

( * ) Notice: Subject to any disclaimer, the term of this patent is extended or adjusted under 35 U.S.C. 154(b) by 347 days.

(21) Appl. No.: 10/394,790

(22) Filed: Mar. 21, 2003

(65) Prior Publication Data
US 2004/0174169 A1 Sep. 9, 2004

(30) Foreign Application Priority Data
Mar. 22, 2002 (DE) .............................. 102 84 213

(51) Int. Cl.
*G01R 31/02* (2006.01)
(52) U.S. Cl. .................. 324/424; 324/422; 324/423
(58) Field of Classification Search ........ 324/415–424; 361/115, 117, 189–191
See application file for complete search history.

(56) References Cited

U.S. PATENT DOCUMENTS

| | | | | |
|---|---|---|---|---|
| 3,604,976 A | * | 9/1971 | Zajic ............................ 315/191 |
| 3,867,686 A | * | 2/1975 | St-Jean ......................... 324/424 |
| 3,942,103 A | * | 3/1976 | Kind et al. .................... 324/424 |
| 5,153,518 A | * | 10/1992 | Satoh et al. .................. 324/424 |

* cited by examiner

Primary Examiner—Vincent Q. Nguyen
(74) Attorney, Agent, or Firm—Hahn Loeser & Parks LLP

(57) ABSTRACT

A method for testing high-voltage alternating-current power switches in a synthetic test circuit has the step of connecting a high-voltage oscillating circuit in parallel to a test switch $B_t$ in a time interval before the current zero of an interruptible high current, which is determined by a half-cycle duration ($T_h/2$) of the oscillating current ($i_h$) less the duration of equivalence ($\Delta t_{se}$) of the sole flow of the oscillating current as sequential current in the test switch with a stress exerted upon the switch by the homogeneous current in a direct test circuit. The sequential-current flow duration of the equivalence results, at least approximately, from the comparison of the values of common physical stress parameters acting in the test switch during the test, on the one hand, in the synthetic test circuit and, on the other hand, in the direct test circuit.

27 Claims, 7 Drawing Sheets

Function values - Table 1

| $f_h$ Hz | Graph Nr. bzw. Glg. Nr. k= ... | $\Delta t_{se}$ μs | p % | $\Delta t_{se}(1\pm\frac{p}{100}) = \Delta t_{se}(p)$ μs | | $\frac{AER(p)}{AER_e}$ % | |
|---|---|---|---|---|---|---|---|
| 500 | Fig. 7, 0 | 230 | +/- | 299 $^0/_0$ | 161 | 90 $^0/_0$ | 111 |
| | 3 | 0/231 / 244 /3 | 0/-30 + | 299 $^0/_3$ | 317 | 90 $^0/_3$ | 90 |
| | 0,00/0,03 | | - | 161 $^0/_3$ | 171 | 111 $^0/_3$ | 112 |
| 250 | Fig. 7, 0 | 488 | 0/-30 +/- | 634 $^0/_3$ | 341 | 89 $^0/_3$ | 111 |
| | 3 | 0/486 / 502 /3 | +30/ + | 631 $^0/_3$ | 653 | 90 $^0/_3$ | 90 |
| | 0,00/0,03 | | - | 340 $^0/_3$ | 351 | 111 $^0/_3$ | 113 |

*Fig. 12*

Function values - Table 2

| $f_h$ Hz | $\vartheta_{sc} = 0.24$ $\dfrac{AER(0.24 \times T_h/2)}{AER_e}$ % k=0,00/0,03 | p % | $\Delta t_{sc}(1 \pm \dfrac{p}{100})$ $= \Delta t_{sc}(p)$ µs | $\dfrac{AER(p)}{AER_e}$ % k=0,00/0,03 |
|---|---|---|---|---|
| 600 | 0 / 99 / 100 / 3 | +30/-30 + | 260 | 88 % / 91 / 3 |
| 600 | | − | 140 | 109 % / 112 / 3 |
| 500 | 0 / 99 / 100 / 3 | + | 312 | 88 % / 91 / 3 |
| 500 | | − | 168 | 110 % / 112 / 3 |
| 350 | 0 / 100 / 102 / 3 | + | 446 | 89 % / 92 / 3 |
| 350 | | − | 240 | 111 % / 113 / 3 |
| 250 | 0 / 101 / 102 / 3 | + | 624 | 90 % / 92 / 3 |
| 250 | | − | 336 | 112 % / 113 / 3 |
| 200 | 0 / 101 / 104 / 3 | + | 780 | 91 % / 92 / 3 |
| 200 | | − | 420 | 113 % / 115 / 3 |

Fig. 13

SYNTHETIC EQUIVALENCE TEST CIRCUIT FOR CIRCUIT BREAKER TESTING

The present invention relates to breaking-capacity test circuits with the main characteristics indicated in the characterizing clause of patent claim 1. The content of my co-pending patent application, U.S. Ser. No. 10/147,552, filed 16 Jul. 2002, is incorporated by reference as if fully recited herein.

BACKGROUND OF THE ART

Synthetic test circuits are known from IEC publication 60427, third edition 2000-04, page 95, Figure BB1.

The "typical current injection circuit with voltage circuit in parallel with the test circuit-breaker" was developed in the early 1950s at the initiative of Professor J. Biermanns, who was then director of the new High-Voltage Institute of AEG in Kassel-Bettenhausen and was formerly director of the AEG-Transformatoren-Fabrik Oberschöneweide ("TRO") in Berlin, to increase the direct testing capacity of the testing department of the Institute.

During the development work, this synthetic test circuit was known in the Institute as "artificial circuit", and Mr. Biermanns, too, always called it the "artificial circuit".

After the "artificial circuit" was put into operation in 1953, the development management of AEG in Frankfurt am Main renamed it the "Weil circuit" and later the "Weil-Dobke circuit," as exemplified in the publications "The Weil-circuit, a circuit to be tested as a high-voltage circuit", by E. Slamecka, in Proceedings from the Opening of the AEG-High-voltage Institute in Kassel, 1953, pp. 52–57, and "Investigation of the AEG test circuit for high-capacity circuit-breakers according to 'Weil-Dobke'", by E. Slamecka, dissertation thesis, Graz (Austria) Institute of Technology, 1955.

However, a more accurate analysis of the German patent specification 962 731 by Fritz Weil ("Weil '731") describing a synthetic test circuit, and of German patent specification 975 303 by G. Dobke ("Dobke '303"), proves that the association of these names with the circuit was an oversight and, therefore, objectively unjustified.

The known prior art described in Weil '731, that is, the AEG "artificial circuit," was mistakenly understood as the subject of his invention and thus erroneously connected with the name of Weil.

Also, Dobke '303, entitled "Supplement to Patent 962 731" (that is, Weil '731), according to disclosed principle and the represented current flow, represents the state of art described and to be improved in Weil '731, the same "artificial circuit" of AEG, and factually forms the patented subject of Weil's invention related back to this state of the art in 1942, invented by unknown inventors in the former TRO. This fact also was overlooked at that time and thus the "artificial circuit" of AEG obtained, again erroneously, the surname "Dobke".

In Weil '731, it is said of the state of the art: "A known test arrangement of this type ("artificial circuit") has the disadvantage that the characteristics of the primary current do not conform to the conditions of the natural test shortly before its zero crossing and the inception of high voltage as recovery voltage, respectively. This is the result of the circumstance that the high-voltage source is already switched to the test switching point before the primary current's zero crossing, so that both currents are superimposed in the breaker gap and result in too high a value." To this, the present inventor adds: "The superimposition of current can also result in an under stressing of the test switch, if the high-voltage source current becomes zero too far away from primary current becoming zero."

The IEC publication 60427, cited above in paragraph [0002], at page 23, indicates limiting values (without disclosing any relation) for the duration of the sole flow of the oscillatory current in the test switch—minimum 200 μs, maximum 500 μs—that should not be exceeded on either side. The publication does not provide information where an equivalence exists in the stress of the test switch in this synthetic test circuit and its stress in a direct test circuit and, if applicable, when (within this time interval) the zero current of the oscillatory current should occur.

During the synthetic test, the auxiliary switch does not relieve a superimposition of the high current with an oscillatory current of opposite polarity, which is a system-immanent characteristic of another known synthetic test circuit shown in IEC publication 60427 at page 97, Figure BB3 and Figure BB4. Therefore, with approximately the same current-breaking capacity of the auxiliary switch and the test switch, the arc voltages of the two switches are also about the same. These voltages in series in the high current circuit can substantially distort the high current.

The known remedy, a high-current transformer, to increase the source voltage in the high-current circuit, is costly and reduces its current yield.

As a result, this state of the art poses three unsolved objects for this invention. First, it asks to clarify whether the problem can be resolved, i.e., as a principle, can an equivalence exist in the loading of the test switch in this synthetic test circuit as compared with a direct test circuit? Second, it seeks to develop a method for determining a set value for the synthetic test circuit, at which the loading of this circuit is equivalent to the loading in a direct test circuit. And, third, it seeks to substantially reduce the loading of the auxiliary switch by arc energy emitted into the interrupter chamber in order to dispense with a high-current transformer with a simultaneously achieved substantially reduced interrupter effect and a corresponding lower arc voltage as well as current distortion.

SUMMARY OF THE INVENTION

These objects are achieved by the characterizing features described below and claimed in the independent claims appended hereto, wherein dependent claims describe further advantageous embodiments of the patent. The substantial and advantageous essence of the inventions consists in the following:

1) A known, necessary, but not sufficient, condition of equivalence is complemented by a second condition of equivalence: arc energy emission of the same level in the interrupter chamber of the test switch within a characteristic time interval that is the same for the synthetic and the direct test circuit;

2) Methods are derived for the numerical determination of the setting magnitude, the "sequential-current flow duration of the equivalence" θ of this synthetic test circuit for an equivalent stress of the comparison switch resulting from the second equivalence condition; the results of calculation and tests relatively conform with each other;

3) A counter-current in an autonomous LC or RC current circuit connected parallel to the auxiliary switch reduces the high current in the auxiliary switch; this makes an auxiliary switch with substantially diminished arc voltage possible, e.g., represented by a vacuum switch, and the current distortion remains within permissible limits without the use of a high-current transformer; also a shortening of the arcing time by a relatively delayed contact separation can relieve the auxiliary switch, and especially effective is the combination of both measures.

BRIEF DESCRIPTION OF THE DRAWINGS

Better understanding of the present inventions will be had by reference to the drawings, wherein identical parts are identified by identical reference numbers or letters, and wherein:

FIG. 12 is a table of function values, referred to as "Table 1"; and

FIG. 13 is a table of function values, referred to as "Table 2."

DETAILED DESCRIPTION OF A PREFERRED EMBODIMENT

Figures 1, 8:
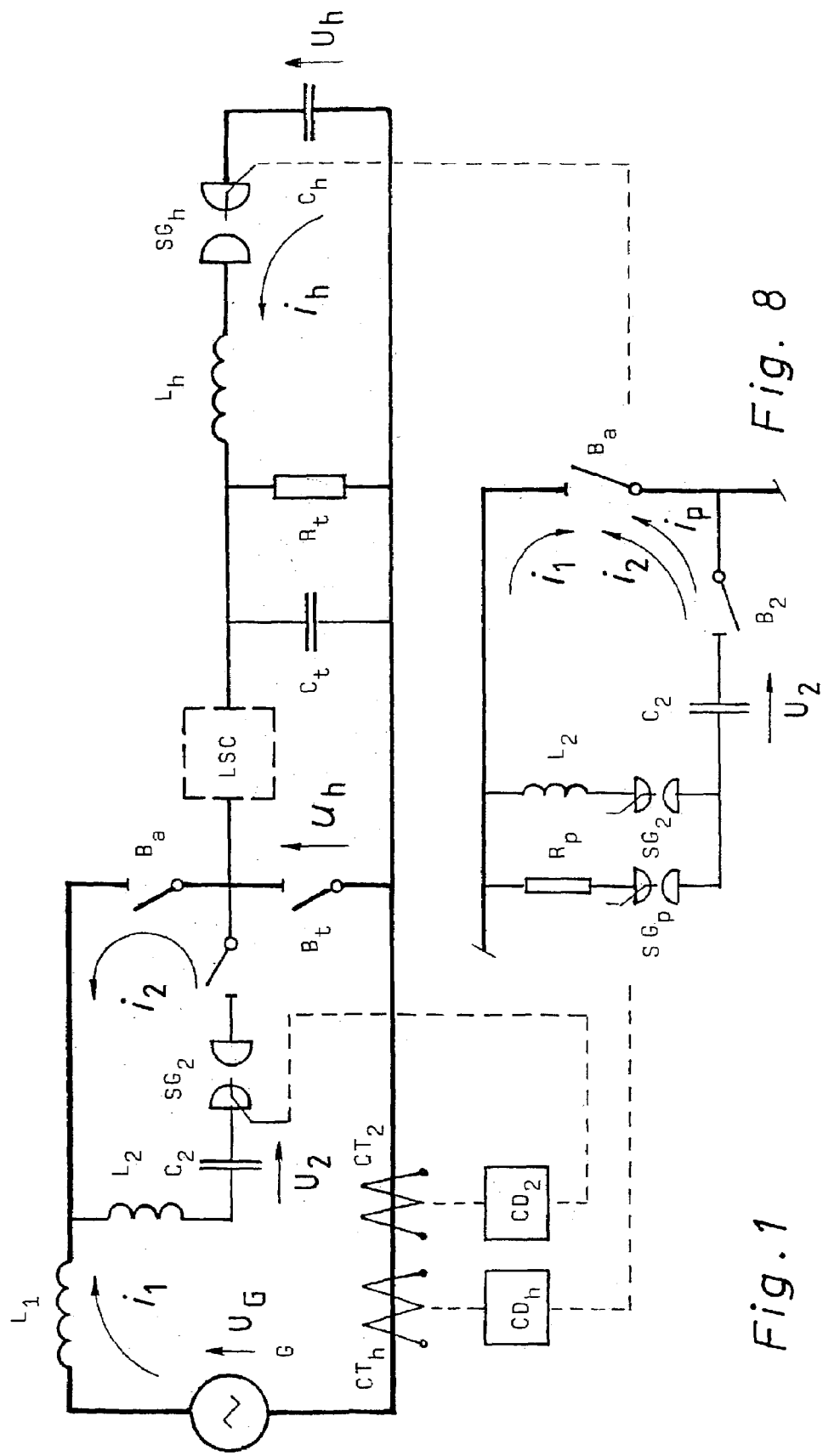
FIG. 1 is a circuit diagram of the synthetic test circuit including a counter-current circuit designed to reduce current in the auxiliary switch.
FIG. 8 is a circuit diagram of an LC counter-current circuit with a biasing current circuit.

The high-current circuit of FIG. 1 comprises: a generator G as a high-current source, with or without a following transformer, if applicable; a resulting inductance $L_1$ co-representing an additional current-limiting inductance; a master circuit breaker (not shown); a making switch (not shown); an auxiliary switch $B_a$; and a test switch $B_t$.

Also shown in FIG. 1, the high-voltage oscillating circuit comprises: a capacitance $C_h$ chargeable to high voltage; an inductance $L_h$; a triggerable spark gap $SG_h$; a capacitance $C_t$ parallel to the test switch, if necessary; an ohmic resistance connected in series; an ohmic resistance $R_t$ connected parallel to the test switch; and, if necessary, a line impedance simulating circuit LSC between the test switch and capacitance $C_t$.

The control consists of a high-current transformer $CT_h$ and a device for generating a time-programmable ignition impulse for the triggerable spark gap $CD_h$.

Figure 2:
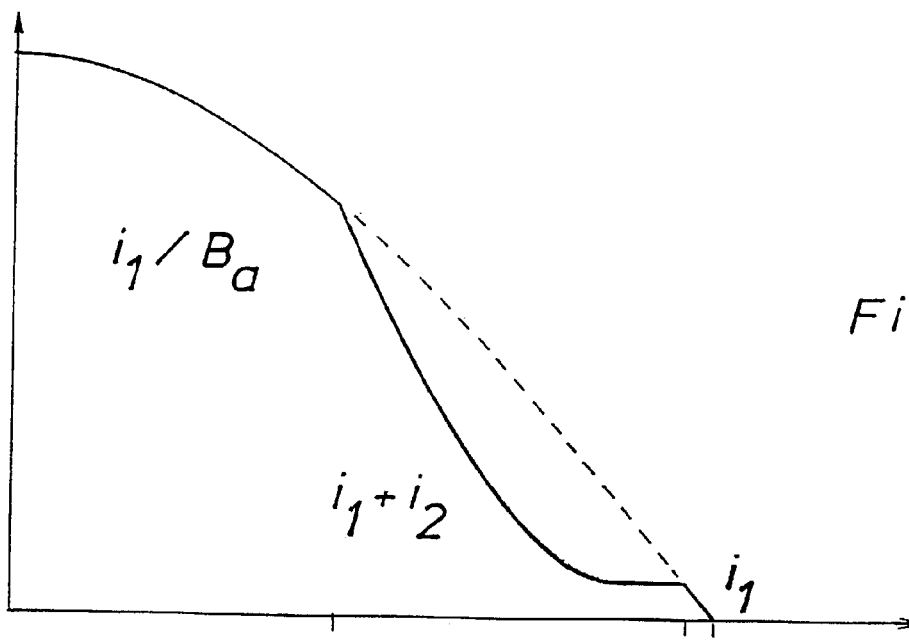
FIG. 2 is a graph showing high-current characteristics in the auxiliary switch, and reduction of the instantaneous values by counter current.
Figure 4:
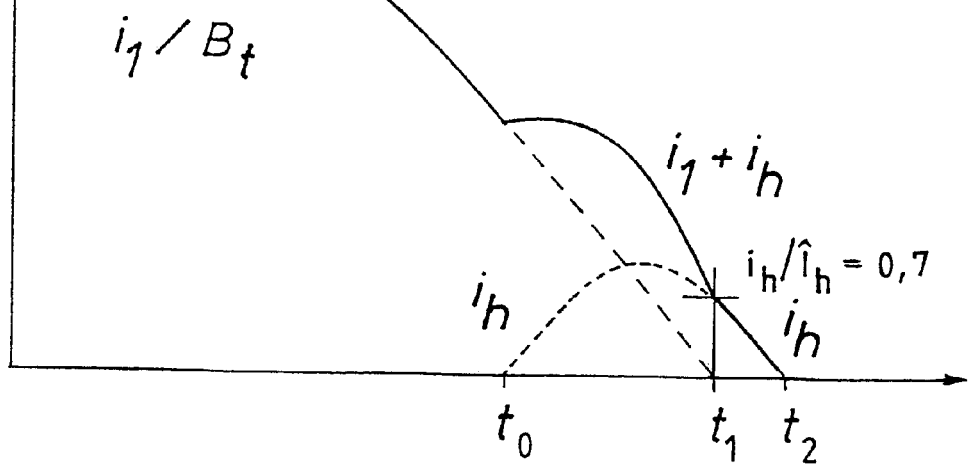
FIG. 4 is a graph showing high-current characteristics in the test switch with high-voltage oscillatory current as superimposed current and sequential current.

With the master circuit breaker and the making switch closed and the auxiliary switch and the test switch opening, a triggerable spark gap $SG_h$ ignites at time $t_0$ shortly before the zero crossing of the arcing currents $i_1/B_a$, $i_1/B_b$, in the two latter switches, as shown in FIGS. 2 and 4, wherein there already exists a possibility of current interruption. Subsequently, a high-voltage oscillatory current $i_h$ overlays a high current $i_1/B_t$ in the test switch, with a resultant current: $i_1+i_h$.

Figure 5:
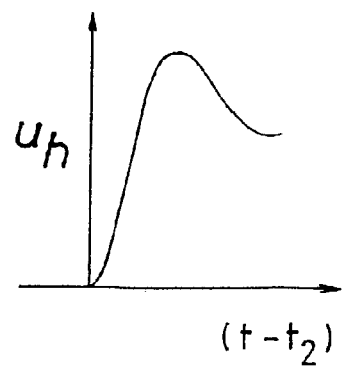
FIG. 5 shows characteristics of the transient recovery voltage.

In the current zero, that is, at time $t_1$, the high current is interrupted by the auxiliary switch. In the test switch, the high-voltage oscillating current continues to flow as sequential current $i_h/B_t$ and, at time $t_2$, reaches the zero value with the same gradient (neglecting any damping) as did the high current prior, as shown in FIGS. 2 and 4. Assuming that the contacts of the test switch are at a sufficient interrupter spacing, voltage $U_h$ of the high-voltage oscillating circuit recovers as transient voltage $u_h$, as shown in FIG. 5. More information regarding the equation and characteristics of this transient recovery voltage, as well as for variants of the high-voltage oscillating circuit in FIG. 1, see "Schaltvorgänge in Hoch- und Niederspannungsnetzen" ("Switching operations in high- and low-voltage grids"), by E. Slamecka and W. Waterschek, Publisher: Siemens AG Berlin und Munich 1972.

When the duration of an oscillating current of a certain constant frequency as a sequential current of the high current changes constantly and monotonously from a very low value—the current zero of the sequential current lies very close to the previous current zero value of the high current and thus an overloading of the test switch can be assumed—to a substantially greater value—current zero—of the sequential current lies temporally substantially remote or distant from the previous current zero—of the high current and thus an under stressing of the test switch can be assumed—we can assume, on the basis of the changing quantum of the emitted arc energy, that between the limiting values of the sequential current duration there exists such a sequential current duration, for which the loading of the test switch in the test circuit with synthetic current is equivalent to the loading of the test switch in a test circuit with homogeneous high current.

From the parallel connection of the high-voltage oscillating circuit to test switch, at to, its interrupter chamber is stressed by thermal energy emanating from the breaking arc with a share of the high current and the oscillating current up to $t_1$, and with a share of the oscillating current only up to $t_2$, as shown in FIG. 4.

During the time interval of a half-cycle of an oscillating circuit, thermal energy which escapes from the homogeneous breaking current's breaking arc puts stress on the test switch's interrupter chamber by the direct test circuit.

$$AER = \frac{W_2 + W_3}{W_1} \tag{1}$$

where $$W_1 = \int_0^{\frac{\pi}{n}} \sin nx\, dx,$$

$$W_2 = \frac{\pi - \arcsin\left(\frac{I_h}{I_h}\right)]/n}{\int_0 \sin nx\, dx},$$

$$W_3 = e^{\frac{k\pi}{n}} \int_0^{\frac{\pi}{n}} e^{-knx} \sin nx\, dx,$$

-continued $$\pi \frac{\Delta t_s}{\frac{T_h}{2}} = \arcsin\left(\frac{j_h}{I_h}\right) = \pi \vartheta_s,$$

$$n = \frac{I_1}{I_h} = \frac{v_0}{\omega} = \frac{T_1}{T_h},$$

$$k = \frac{\delta}{v_0} = \left[1 - \left(\frac{v}{v_0}\right)^2\right]^{0.5} \text{ and}$$

$$\delta = \frac{R}{2L}.$$

The relationship of these assigned energies is described in equation (1) as a function of duration $\Delta t_s$ of the sole oscillating current flow in the test switch with equation parameters n and k in conformity with the indicated definition.

In equation (1), the damping of the oscillating current is reflected and the deficit in current gradient of the oscillating current in the current zero value is compensated. FIG. 121 and Table 33 of the already cited textbook (paragraph [0033] above) contain graphs with oscillating current characteristics with different levels of damping and the pertaining equations.

Figure 6:
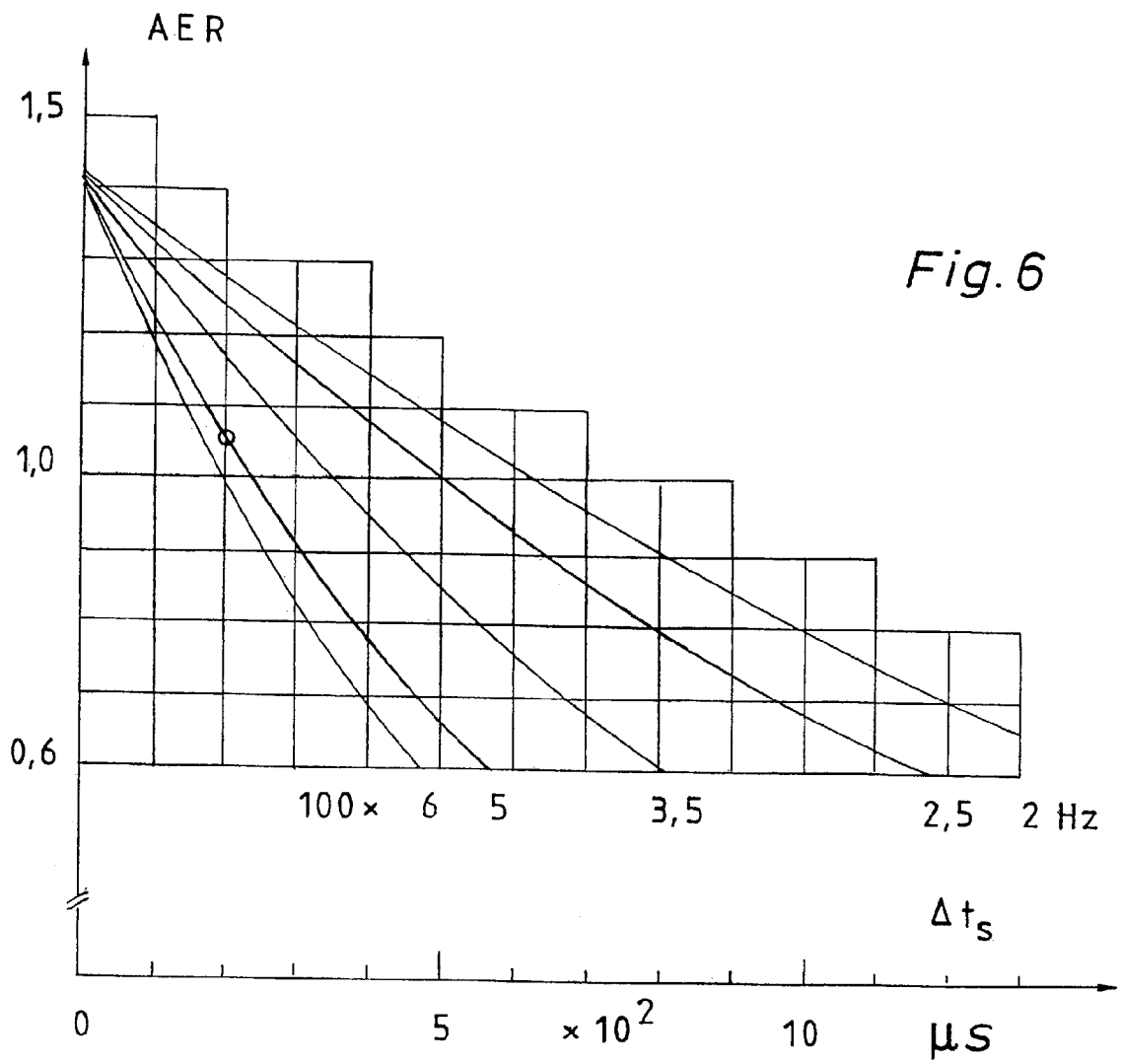
FIG. 6 is a graphical representation of the function equation (1)

FIG. 6 shows graphs of equation (1) for different n values with undamped oscillating current, k=0; thus resulting in, e.g. for n=10 and $i_h/I_h$=1, $\Delta t_s$=500 μs and AER=0.66, that implies that the test switch is understressed by 34%.

Equivalence of the thermal stress of the test switch exists in the point of intersection of the function graphs with the equivalence horizontal, that is:

$$AER=1; \tag{2}$$

from the graph for n=10, FIG. 6, we obtain the equivalence-sequential-current-flow-duration of $\Delta t_{se}$=230 μs for the selected example. comparison tests at approximately this sequential-current duration, as shown by the marking by a circle in FIG. 6, as well as in "Prüfung von Hochspannungsschaltern in der AEG-'Kunstschaltung'" ("Testing of high-voltage switches in AEG 'artificial circuit'"), by F. Petermichl, VDE-*Fachberichte* (Professional Reports), Volume 18, 1954.

Figure 7:
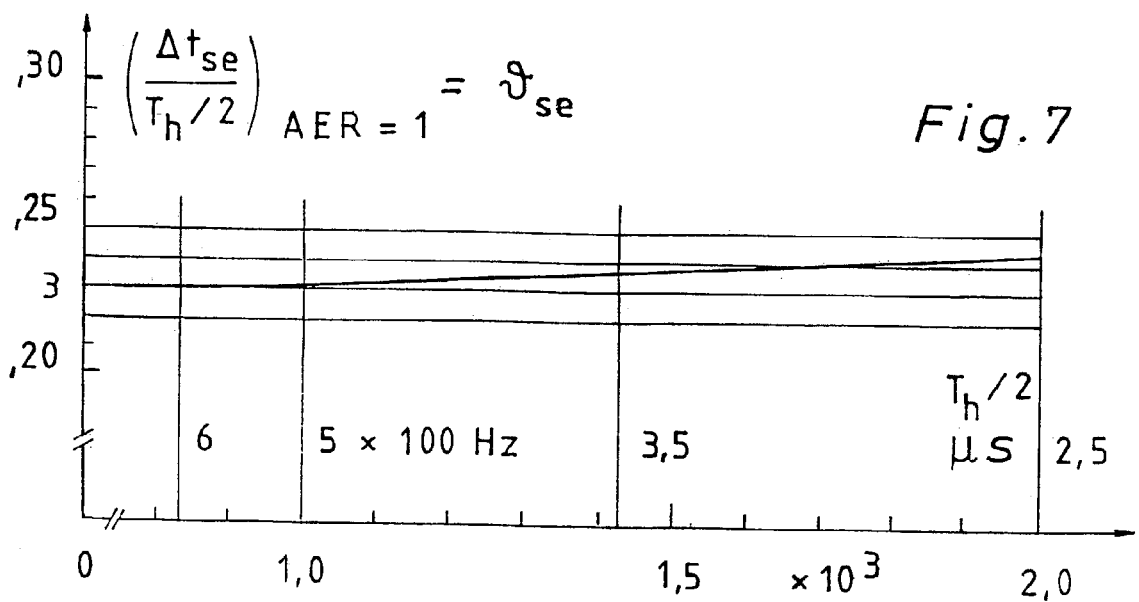
FIG. 7 is a graph of "sequential current duration of equivalence" related to the oscillatory current half-cycle duration in dependence on this half-cycle duration, determined from FIG. 6 when AER=1.

If the sequential current durations of equivalence determined from the graph in FIG. 6 are related to the half-cycle durations underlying each of them and the numeric values recorded in a Cartesian system of coordinates over the reference half-cycle duration, we obtain the following function graph:

$$\Delta t_{se}/(T_h/2)=\theta_{se}=f(T_h/2), \text{ as shown in FIG. 7.}$$

For $f_h$=1000 Hz up to approximately 500 Hz, the related equivalence sequential current duration is practically constant and then increases, with a very small ascent, practically linearly.

With regard to deviations from the equivalence-sequential-current-duration $\Delta t_{se}$, a tolerance of ±30% is indicated, wherein a change in $\Delta t_{se}$ influences the equivalence AER in a strongly diminished manner as function values tables will show later.

The related equivalence-sequential-current-flow-duration can be also described and/or determined by means of an algebraic equation (3), which is derived from equation (2) among other things, and is as follows:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5}, \tag{3}$$

where $$\kappa_1 = \frac{\int_0^{\frac{\pi}{n}} x dx}{W_1} = 1 + \varepsilon_1,$$

$$\kappa_2 = \frac{\int_0^{\frac{\pi(1-\vartheta_{se})}{n}} x dx}{W_2} = 1 + \varepsilon_2,$$

$$\kappa_2 < \kappa_1$$

$$\left(\frac{\kappa_2}{\kappa_1}\right)^{0.5} = 1 + \frac{(\varepsilon_2 - \varepsilon_1)}{2}$$

The problem that the parameter to be determined $\theta_{se}$ is also present in the expression on the right side of equation (3) is practically resolved by a characteristic of this expression as explained under equation (3)—expansion into a series and neglect of the product of small parameters. If desired, with the ratio of $\kappa_2$ to $\kappa_1$ equal to one, a first $\theta_{se}$ value may be determined, and, in a second calculation step, an $\theta_{se}$ value of an even higher accuracy may be determined.

The graph for $\theta_{se}$ with k=0 described by equation (3) progresses practically congruently with the course of $\theta_{se}$ shown in FIG. 7, which was determined partially numerically, partially graphically. This can also be derived from equation (3) for $f_h$ equal to or less than 500 Hz and k=0.00: $\theta_{se}$=const.=0.23.

And also the $\theta_{se}$ values determined from equation (3) under damping influence are practically identical with the numerically and graphically determined $\theta_{se}$ values—no longer noted.

Here too, any deviations of the equivalence sequential current flow duration, at least up to ±30%, have very little effect on the AER of the equivalence. This is demonstrated by the mutually assigned numeric values of the function values Table 1 (FIG. 12) for oscillating current frequencies of 500 Hz and 250 Hz with damping of κ=0 or κ=0.03.

By comparison, with limiting values independently set for the sequential-current-flow-duration, the actual numbers already indicated in paragraph [0010] above, stress on the test switch can occur substantially above or remaining under the tolerance-AER-values, AER(p), as given in the table:

sequential-current-duration set to 200 μs, potentially assigned oscillating current with $f_h$=250 Hz: AER=1.25, i.e., thermal stress on the test switch 25% too high.

sequential current duration set to 500 μs, potentially assigned oscillating current with $f_h$=500 Hz: AER=0.66, i.e., thermal stress on the test switch 34% too low.

A graph described by equation (3) or numerically and graphically determined, as shown in FIG. 7, in its linearly ascending portion, can be approximated by means of a horizontal straight line with a small slope, at least in certain sections:

$$\theta_s=\text{const.}=\theta_{sc} \tag{4}$$

Within the frequency range below $f_h$=500 Hz, such a horizontal straight line is already defined by the function, as shown in FIG. 7. Within the frequency range above $f_h$=500

Hz, a practically suitable horizontal straight line intersecting the function graph exists, e.g., with $\theta_{sc}=0.24.$ The horizontal straight line can approximate the function graph or touch it also only from one side.

The following relation applies to deviations from the selected basis:

$$\theta_{sp}=\theta_{sc}(1\pm p/100) \quad (5)$$

with p=30% as the maximum value. Numeric values of the pertaining function AER(p) with κ=0.00 and 0.03 for oscillating current frequencies from 500 Hz to 200 Hz are indicated in the function values Table 2, shown in FIG. 13. This table also shows (Column 2) that, with the selected $\theta_{sc}$=0.24, the AER values calculated for the range limits only slightly deviate from the equivalence AER value one—maximum by 2% with $f_h$=250 Hz.

The following data are represented in the graph of current overlay and current sequence in the test switch, as shown in FIG. 4:

N=5, κ=0.00, $i_h/I_h$=0.707, $\Delta t_s$=500 micro seconds, $\theta_s$=0.25, AER=0.99;

deviations of $\theta_{se}$=0.243 and AER=1 account for +2.9%−1%.

One possibility for releasing the auxiliary switch in order to dispense with a high-current transformer results as follows: By opening the contacts of the auxiliary switch only at the crest of the last oscillation of the high current, instead of at the very beginning, the arcing energy stressing the switch is reduced by half, as shown by the integrals over the products from arcing current and the arcing voltage assumed to be constant over various integration time intervals (not represented).

With this substantially diminished thermal pre-stressing, the acting of the arc-extinguishing medium on the arc can also be substantially diminished and thus the arcing voltage of the auxiliary switch decreases. Therefore, generally speaking, it is useful to trigger the auxiliary switch in such a manner that the duration of the arc in the breaker gap is shorter than the duration of the last oscillation of the high current.

In addition, it is useful if the contacts of the auxiliary switch reach the insulating distance for the recovery voltage in the time remaining until the high current reaches zero value, by means of an economical operating mechanism.

The counter directions of these measures performed with relation to the auxiliary switch—on the one hand, diminishing the arcing energy by a relative delay in the contact separation and, on the other hand, increasing the contact separation speed, which is connected with an increased cost of the contact operating mechanism—allows for technically and economically optimum expectations when the contacts are separated within the range of the peak value of the high current.

Then—with the interrupter chamber having to deal with only half the arcing energy—the contacts have about 5 ms to reach the full insulating distance; with a contact (separation) speed of, for example, v=2 m/s, it results in 10 mm per interrupter unit of a vacuum switch, whose contacts have this speed already during the separation.

The auxiliary switch $B_a$ can be substantially relieved from arcing stress also by a new technology of current injection. The goal is the same: to eliminate the need of a high-current transformer.

Figure 3:
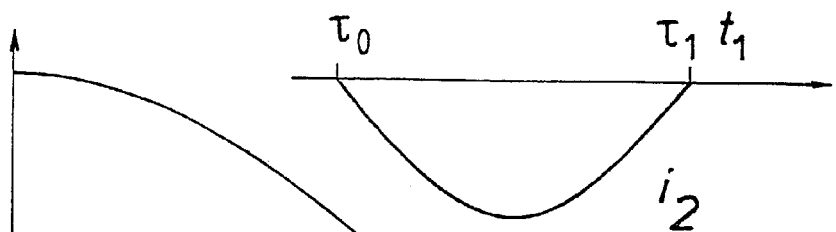
FIG. 3 shows characteristics of the counter current represented by oscillatory current.

A first open oscillating circuit in parallel connection with the auxiliary switch comprises the following components: capacitance $C_2$ chargeable with potential, inductance $L_2$, a triggerable spark gap $SG_2$, auxiliary switch $B_2$, as shown in FIG. 1. Before the high current $i_1$ reaches the last zero value, with conductive breaker gap of switch $B_2$, the oscillating circuit is closed by arcing the spark gap $SG_2$, at time $\tau_0$, as shown in FIGS. 2 and 3. A half-cycle of the oscillating current $i_2$—with opposite polarity, about the same steepness in the current zero but with higher frequency and an amplitude diminished in the frequency ratio—is then superimposed to the oscillation of the high current $i_1$. The current zero of the oscillating current occurs at time $\tau_1$ before the current zero of the high current at time $t_1$ and at the latest also at this time.

This tuning of the two currents results, in the coverage range of their almost linear course, approximately in an almost a constant level. By bringing the current zero closer to the current zero of the high current, this level can be practically freely decreased and therefore also the current stress of the auxiliary switch $B_a$.

The initial voltage $U_2$ on capacitance $C_2$ needs to be only clearly higher than the arcing voltage of the auxiliary switch $B_a$ held low by the current-injection effect, e.g., 500 V with about 50 V arcing voltage of a vacuum switch.

After the current zero of the oscillating current $i_h$ in the test switch, the breaker gaps of both switches $B_a$ and $B_2$ are stressed by the recovery voltage $u_h$, as shown in FIG. 5. The auxiliary switch $B_2$ had to interrupt only the oscillating current $i_2$, relatively small in amplitude and flow duration; it is 8 kA with 200 Hz in the example embodiment, when the breaking current of the test switch equals 32 kA with 50 Hz. The design and ratings of the relieving oscillation circuit results from the minimization of the total expense including the cost of the auxiliary switch $B_a$.

According to the circuit diagram, as shown in FIG. 1, the contacts of the switch $B_2$ must closed until the arcing of the triggerable spark gap $SG_2$, so that subsequently the relieving oscillation current $i_2$ can flow. Now, only very little time remains to reach the insulating distance. The high cost of an accordingly high contact speed can be avoided by an arcing pre-current $i_p$. For this purpose, an ohmic resistance $R_p$ and a triggerable spark gap $SG_p$, as shown in FIG. 8, must be connected parallel to the inductance $L_2$ and the triggerable spark gap $SG_2$, as shown in FIG. 8.

If the contacts of the switch $B_2$ now separate—for simplicity's sake, at about the same time as the contacts of the auxiliary switch $B_a$—and the spark gap $SG_p$ is arced at the same time—or shortly before that—a pre-current $i_p$ with, e.g., 10 A, flows through its contacts; the arc maintains the break distance of the switch $B_2$ conductive until a subsequent arcing of the triggerable spark gap $SG_2$ at time $\tau_0$.

Figure 9:
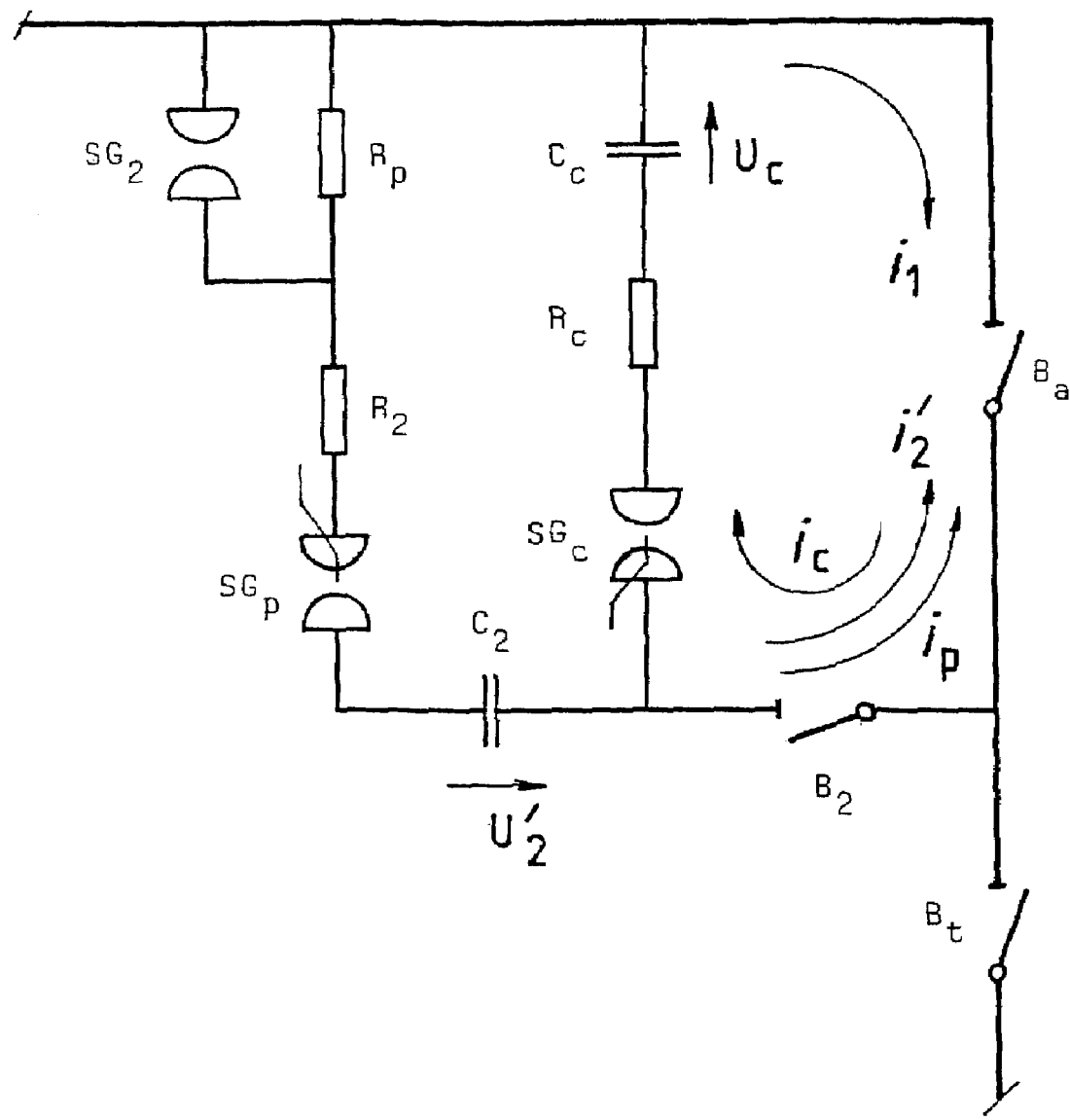
FIG. 9 is a circuit diagram of an RC counter-current circuit with generation of biasing current.

Alternatively, to relieve the current stress, the high current in the auxiliary switch $B_a$ can also be injected by an aperiodic current $i_2$ with opposite polarity according to the circuit diagram shown in FIG. 9. At the latest upon the separation of the contacts of the auxiliary switch $B_a$, the triggerable spark gap $SG_p$ arced by a control device (not shown) closes the pre-current circuit formed by ohmic resistors $R_2$ and $R_p$, and by switches $B_2$ and $B_a$.

The small pre-current $i_p$ flowing through switches $B_2$ and $B_a$ is practically determined by the pre-current resistor $R_p$. At the separation of contacts in switch $B_2$, this current transforms into an arc current and maintains the breaker gap conductive. At the time $\tau_0$, the triggerable spark gap $SG_2$ is arced by the control device $CD_2$ as shown in FIG. 1, and thus the pre-current resistor $R_p$ is bypassed.

Figures 10, 11:
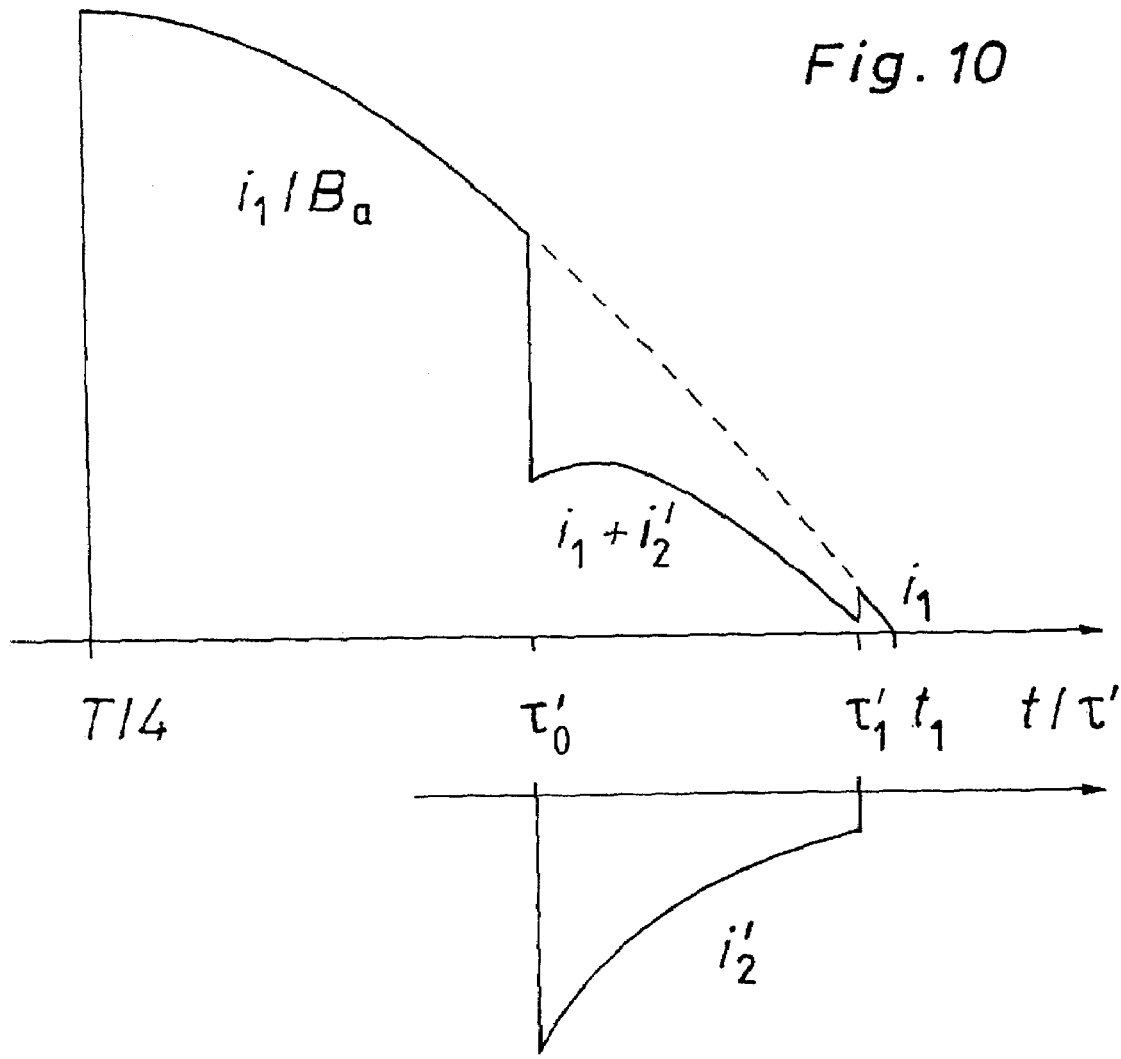
FIG. 10 shows high current characteristics in an auxiliary switch with RC counter current
FIG. 11 shows a counter current represented by aperiodic current.

The relieving current $i'_2$ to be applied, also an exponentially decaying direct current, as shown in FIG. 11, is superimposed to the high current $i_1$ in auxiliary switch $B_a$ with opposite polarity. The resulting current $$(i_1+i'_2)$$

in the time interval $(\tau_1'-\tau_0')$, as shown in FIG. 10, requires a substantially lower interrupter action with correspondingly lower arc voltage of the auxiliary switch $B_a$. The influence of the distributed line inductance on the current characteristics of $i_2'$ and $(i_1+i_2')$ was neglected. In order to obtain a possibly useful special form of the aperiodic current $i_2'$, the relieving current circuit can be complemented by a concentrated inductance (not shown); for current characteristics graphs and calculation formulae see the already cited textbook, pages 272/3, at paragraph [0033] above.

To interrupt the relieving current $i_2'$, the triggerable spark gap $SG_c$ is arced at the interruption time $t_1'$; it can be done by means of control device $CD_2$, when it is generating a second arcing impulse, which is switched through to the starting electrode of the triggerable spark gap $SG_c$ with a delay of $(\tau_1'-\tau_0')$. This spark gap closes the current circuit with the capacitance $C_c$—charged to direct voltage $U_c$—and the ohmic resistor $R_c$. The current zero generating current $i_c$ in this circuit equally closed by switches $B_2$ and $B_a$ is designed in its magnitude and polarity in such a manner that it reduces the relieving current $i_2'$ for interruption in the switch $B_2$ to zero. This current zero generating current can be also an oscillating current in a higher-frequency oscillating circuit.

By analogy to FIG. 8, ohmic resistor $R_p$ and the apportioning triggerable spark gap $SG_p$, as shown in FIG. 9, can be also arranged parallel to the ohmic resistor $R_2$ and the apportioning triggerable spark gap $SG_2$.

Especially in case of an oscillating current being the relieving current of the auxiliary switch $B_a$, the switch $B_2$ and the triggerable spark gap SG2 together can be advantageously substituted by a high-speed switching device with fixed contacts, in vacuum or in an $SF_6$ atmosphere. The closing of this device is actuated by an arcing spark through a trigger gap on one of the two fixed contacts, triggered by the control device $CD_2$ as shown in FIG. 1. The then flowing oscillating current is interrupted by the fixed contact arrangement with breaking capacity (not shown in the Figures).

The reduction of the stress of the auxiliary switch exerted by thermal energy of the high current arc by means of the previously explained counter-current circuits can be substantially improved by a complementing measure. For this purpose, before injecting the counter current, the duration of the arc current flow is shortened by opening the contacts of the auxiliary switch $B_a$ with a delay in relation to the last but one high current zero.

What is claimed is:

1. A method for testing high-voltage alternating-current power switches in a synthetic test circuit with a high-current circuit comprising a high-current source connected in series with at least one auxiliary switch and one test switch, and with a high-voltage oscillating circuit comprising a high-voltage source to be connected parallel to the test switch before the current zero of the high current, at which already an interruption possibility exists, and conducting an oscillating current, comprising the step of:

connecting the high-voltage oscillating circuit in parallel to the test switch in a time interval before the current zero of the high current with an interruption possibility, which is determined by a half-cycle duration $(T_h/2)$ of the oscillating current $(i_h)$ less the duration of equivalence $(\Delta t_{se})$ of the sole flow of the oscillating current as sequential current in the test switch with a stress exerted upon the switch by the homogeneous current in a direct test circuit, wherein the sequential-current flow duration of the equivalence results, at least approximately, from the comparison of the values of common physical stress parameters acting in the test switch during the test, on the one hand, in the synthetic test circuit and, on the other hand, in the direct test circuit.

2. The method for testing of claim 1, wherein:

the sequential-current flow duration of equivalence results from the condition that the emissions of arc energy in the test switch in an approximately equally long time interval before the last current zero in the synthetic test circuit and in the direct test circuits are at least approximately equal.

3. The method of testing of claim 2, wherein:

the sequential-current flow duration of equivalence results from the ratio of emitted arc energies described by the function equation $$AER = \frac{W_2 + W_3}{W_1}$$

in the synthetic test circuit, on the one hand, and in the direct test circuit, on the other hand, when this ratio attains the value of one, and wherein a deviation from the duration of equivalence of the sole flow of the oscillating current in the test switch determined thereby is maximum plus/minus 30%.

4. The method of testing of claim 2, wherein:

the sequential-current flow duration of equivalence related to the half-cycle duration $(T_h/2)$ of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5}$$

wherein a deviation from the relative duration of equivalence of the sole flow of the oscillating current in the test switch determined thereby is maximum plus/minus 30%.

5. The method of test of claim 2, wherein:

the sequential-current flow duration of equivalence related to the half-cycle duration $(T_h/2)$ of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5} = \text{const.} = \vartheta_{sc}$$

wherein the value of the constant is set so that the thus represented function graph approximates to the function graph of equivalence at least in sections, to the maximum of these two function graphs intersecting each other, and a deviation from the relative duration of the sole flow of the oscillating current in the test switch determined thereby is maximum plus/minus 30%.

6. The method of testing of claim 1, wherein:
the sequential-current flow duration of equivalence results from the ratio of emitted arc energies described by the function equation $$AER = \frac{W_2 + W_3}{W_1}$$

in the synthetic test circuit, on the one hand, and in the direct test circuit, on the other hand, when this ratio attains the value of one, and
wherein a deviation from the duration of equivalence of the sole flow of the oscillating current in the test switch determined thereby is maximum plus/minus 30%.

7. The method of testing of claim 1, wherein:
the sequential-current flow duration of equivalence related to the half-cycle duration ($T_h/2$) of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5}$$

wherein a deviation from the relative duration of equivalence of the sole flow of the oscillating current in the test switch determined thereby is maximum plus/minus 30%.

8. The method of test of claim 1, wherein:
the sequential-current flow duration of equivalence related to the half-cycle duration ($T_h/2$) of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5} = \text{const.} = \vartheta_{sc}$$

wherein the value of the constant is set so that the thus represented function graph approximates to the function graph of equivalence at least in sections, to the maximum of these two function graphs intersecting each other, and a deviation from the relative duration of the sole flow of the oscillating current in the test switch determined thereby is maximum plus/minus 30%.

9. A synthetic test circuit for high-voltage alternating-current power-breakers with a high-current circuit, said test circuit comprising:
a high current source connected in series with at least one auxiliary switch and one test switch, and
with a high-current oscillating circuit comprising a high-voltage source to be connected parallel to the test switch before the current zero of the high current, at which already an interruption possibility exists, and conducting an oscillating current,
wherein the auxiliary switch is triggered in time so that the contacts thereof separate, within the time interval of a partial oscillation of the high current, at which current zero already a possibility to interrupt the circuit by the test switch exists, shortly before reaching the peak current value, in the peak current value, or shortly after reaching the peak current value.

10. A synthetic test circuit for high-voltage alternating-current circuit-breakers, comprising:

a high-current circuit containing a high current source connected in series with at least one auxiliary switch and one test switch, and with a high-current oscillating circuit comprising a high-voltage source to be connected parallel to the test switch before the current zero of the high current, at which already an interruption possibility exists, and conducting an oscillating current,
wherein a open current circuit, comprising a voltage-conducting capacitance chargeable with voltage connected in series with at least one current-limiting resistor, is connected parallel to the auxiliary switch, and the current circuit is closed by means of a switching mechanism device before a current zero of the high current with interrupting possibility by the test switch, whereupon a current of relatively smaller amplitude and opposite polarity is superimposed to the high current in the auxiliary switch,
wherein the superimposed current is interrupted by the same or by another switching mechanism before or at the time of the current zero of the high current.

11. The test circuit of claim 10, further comprising:
a capacitance conducting voltage and connected in series with at least one inductance is connected in parallel to the auxiliary switch before the last current zero of the high current through a controlled triggerable spark gap, whereupon an oscillating current of relatively smaller amplitude and higher frequency with opposite polarity is superimposed to the high current, and this superimposed current is interrupted by a switch in a current zero before or at the time of the current zero of the high current.

12. The test circuit of claim 11, wherein:
the auxiliary switch is triggered in time so that the contacts thereof separate, within the time interval of a partial oscillation of the high current, at which current zero already exists as a possibility to interrupt the circuit by the test switch, shortly before reaching the peak current value, in the peak current value, or shortly after reaching the peak current value.

13. The test circuit of claim 10, further comprising:
a capacitance conducting voltage and connection in series with at least one ohmic resistor is connected in parallel to the auxiliary switch before the last current zero of the high current through a controlled triggerable spark gap, whereupon an aperiodic current of relatively smaller amplitude with opposite polarity is superimposed to the high current, and the superimposed current is interrupted by a switch in a current zero before or a the time of the current zero of the high current.

14. The test circuit of claim 13, wherein:
the auxiliary switch is triggered in time so that the contacts thereof separate, within the time interval of a partial oscillation of the high current, at which current zero already exists as a possibility to interrupt the circuit by the test switch, shortly before reaching the peak current value, in the peak current value, or shortly after reaching the peak current value.

15. The test circuit of claim 10, wherein:
the auxiliary switch is triggered in time so that the contacts thereof separate, within the time interval of a partial oscillation of the high current, at which current zero already exists as a possibility to interrupt the circuit by the test switch, shortly before reaching the peak current value, in the peak current value, or shortly after reaching the peak current value.

16. A method for testing high-voltage alternating-current power switches in a synthetic test circuit with a high-current circuit comprising a high-current source connected in series with at least one auxiliary switch and one test switch, and with a high-voltage oscillating circuit comprising a high-voltage source to be connected parallel to the test switch before the current zero of the high current, at which already an interruption possibility exists, and conducting an oscillating current, comprising the step of:

connecting the high-voltage oscillating circuit in parallel to the test switch in a time interval before the current zero of the high current with an interruption possibility, which is determined by a half-cycle duration ($T_h/2$) of the oscillating current ($i_h$) less the duration of equivalence ($\Delta t_{se}$) of the sole flow of the oscillating current as sequential current in the test switch with a stress exerted upon the switch by the homogeneous current in a direct test circuit, wherein the sequential-current flow duration of the equivalence results, at least approximately, from the comparison of the values of common physical stress parameters acting in the test switch during the test, on the one hand, in the synthetic test circuit and, on the other hand, in the direct test circuit, and wherein the sequential-current flow duration of equivalence results from the condition that the emissions of arc energy in the test switch in an approximately equally long time interval before the last current zero in the synthetic test circuit and in the direct test circuits are at least approximately equal.

17. The method of testing of claim 16, wherein:

the seqential-current flow duration of equivalence results from the ratio of emitted arc energies described by the function equation $$AER = \frac{W_2 + W_3}{W_1}$$

in the synthetic test circuit, on the one hand, and in the direct test circuit, on the other hand, when this ratio attains the value of one, and wherein a deviation from the duration of equivalence of the sole flow of the oscillating current in the test switch determined thereby is maximum plus/minus 30%.

18. The method of testing of claim 16, wherein:

the sequential-current flow duration of equivalence related to the half-cycle duration ($T_h/2$) of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5}$$

wherein a deviation from the relative duration of equivalence of the sole flow of the oscillating current in the test switch determined thereby is maximum plus/minus 30%.

19. The method of test of claim 16, wherein:

the sequential-current flow duration of equivalence related to the half-cycle duration ($T_h/2$) of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5} = \text{const.} = \vartheta_{sc}$$

wherein the value of the constant is set so that the thus represented function graph approximates to the function graph of equivalence at least in sections, to the maximum of these two function graphs intersecting each other, and a deviation from the relative duration of the sole flow of the oscillating current in the test switch determined thereby is maximum plus/minus 30%.

20. A method for testing high-voltage alternating-current power switches in a synthetic test circuit with a high-current circuit comprising a high-current source connected in series with at least one auxiliary switch and one test switch, and with a high-voltage oscillating circuit comprising a high-voltage source to be connected parallel to the test switch before the current zero of the high current, at which already an interruption possibility exists, and conducting an oscillating current, comprising the step of:

connecting the high-voltage oscillating circuit in parallel to the test switch in a time interval before the current zero of the high current with an interruption possibility, which is determined by a half-cycle duration ($T_h/2$) of the oscillating current ($i_h$) less the duration of equivalence ($\Delta t_{se}$) of the sole flow of the oscillating current as sequential current in the test switch with a stress exerted upon the switch by the homogeneous current in a direct test circuit, wherein the sequential-current flow duration of the equivalence results, at least approximately, from the comparison of the values of common physical stress parameters acting in the test switch during the test, on the one hand, in the synthetic test circuit and, on the other hand, in the direct test circuit, and wherein the sequential-current flow duration of equivalence results from the ratio of emitted arc energies described by the function equation $$AER = \frac{W_2 + W_3}{W_1}$$

in the synthetic test circuit, on the one hand, and in the direct test circuit, on the other hand, when this ratio attains the value of one, and wherein a deviation from the duration of equivalence of the sole flow of the oscillating current in the test switch determined thereby is maximum plus/minus 30%.

21. A method for testing high-voltage alternating-current power switches in a synthetic test circuit with a high-current circuit comprising a high-current source connected in series with at least one auxiliary switch and one test switch, and with a high-voltage oscillating circuit comprising a high-voltage source to be connected parallel to the test switch before the current zero of the high current, at which already an interruption possibility exists, and conducting an oscillating current, comprising the step of:

connecting the high-voltage oscillating circuit in parallel to the test switch in a time interval before the current zero of the high current with an interruption possibility, which is determined by a half-cycle duration ($T_h/2$) of the oscillating Current ($i_h$) less the duration of equivalence ($\Delta t_{se}$) of the sole flow of the oscillating current as sequential current in the test switch with a stress exerted upon the switch by the homogeneous current in a direct test circuit, wherein the sequential-current flow duration of the equivalence results, at least approximately, from the comparison of the values of common physical stress parameters acting in the test switch during the test, on the one hand, in the synthetic test circuit and, on the other hand, in the direct test circuit, and wherein the sequential-current flow duration of equivalence related to the half-cycle duration ($T_h/2$) of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5}$$

wherein a deviation from the relative duration of equivalence of the sole flow of the oscillating current in the test switch determined thereby is maximum plus/minus 30%.

22. A method for testing high-voltage alternating-current power switches in a synthetic test circuit with a high-current circuit comprising a high-current source connected in series with at least one auxiliary switch and one test switch, and with a high-voltage oscillating circuit comprising a high-voltage source to be connected parallel to the test switch before the current zero of the high current, at which already an interruption possibility exists, and conducting an oscillating current, comprising the step of:

connecting the high-voltage oscillating circuit in parallel to the test switch in a time interval before the current zero of the high current with an interruption possibility, which is determined by a half-cycle duration ($T_h/2$) of the oscillating current ($i_h$) less the duration of equivalence ($\Delta t_{se}$) of the sole flow of the oscillating current as sequential current in the test switch with a stress exerted upon the switch by the homogeneous current in a direct test circuit, wherein the sequential-current flow duration of the equivalence results, at least approximately, from the comparison of the values of common physical stress parameters acting in the test switch during the test, on the one hand, in the synthetic test circuit and, on the other hand, in the direct test circuit, and wherein the sequential-current flow duration of equivalence related to the half-cycle duration ($T_h/2$) of the oscillating current is given by the equation:

$$\frac{\Delta t_{se}}{\frac{T_h}{2}} = \vartheta_{se} = 1 - \left[\left(\frac{\kappa_2}{\kappa_1}\right)\left(1 - \frac{W_3}{W_1}\right)\right]^{0.5} = \text{const.} = \vartheta_{sc}$$

wherein the value of the constant is set so that the thus represented function graph approximates to the function graph of equivalence at least in sections, to the maximum of these two function graphs intersecting each other, and a deviation from the relative duration of the sole flow of the oscillating current in the test switch determined thereby is maximum plus/minus 30%.

23. A synthetic test circuit for high-voltage alternating-current circuit-breakers, comprising:

a high-current circuit containing a high current source connected in series with at least one auxiliary switch and one test switch, and with a high-current oscillating circuit comprising a high-voltage source to be connected parallel to the test switch before the current zero of the high current, at which already an interruption possibility exists, and conducting an oscillating current, wherein a open current circuit, comprising a voltage-conducting capacitance chargeable with voltage connected in series with at least one current-limiting resistor, is connected parallel to the auxiliary switch, and the current circuit is closed by means of a switching mechanism device before a current zero of the high current with interrupting possibility by the test switch, whereupon a current of relatively smaller amplitude and opposite polarity is superimposed to the high current in the auxiliary switch, wherein the superimposed current is interrupted by the same or by another switching mechanism before or at the time of the current zero of the high current, and wherein a capacitance conducting voltage and connection in series with at least one inductance is connected in parallel to the auxiliary switch before the last current zero of the high current through a controlled triggerable spark gap, whereupon an oscillating current of relatively smaller amplitude and higher frequency with opposite polarity is superimposed to the high current, and this superimposed current is interrupted by a switch in a current zero before or at the time of the current zero of the high current.

24. The test circuit of claim 23, wherein:

the auxiliary switch is triggered in time so that the contacts thereof separate, within the time interval of a partial oscillation of the high current, at which current zero already exists as a possibility to interrupt the circuit by the test switch, shortly before reaching the peak current value, in the peak current value, or shortly after reaching the peak current value.

25. A synthetic test circuit for high-voltage alternating-current circuit-breakers, comprising:

a high-current circuit containing a high current source connected in series with at least one auxiliary switch and one test switch, and with a high-current oscillating circuit comprising a high-voltage source to be connected parallel to the test switch before the current zero of the high current, at which already an interruption possibility exists, and conducting an oscillating current, wherein a open current circuit, comprising a voltage-conducting capacitance chargeable with voltage connected in series with at least one current-limiting resistor, is connected parallel to the auxiliary switch, and the current circuit is closed by means of a switching mechanism device before a current zero of the high current with interrupting possibility by the test switch, whereupon a current of relatively smaller amplitude and opposite polarity is superimposed to the high current in the auxiliary switch, wherein the superimposed current is interrupted by the same or by another switching mechanism before or at the time of the current zero of the high current, and wherein the auxiliary switch is triggered in time so that the contacts thereof separate, within the time interval of a partial oscillation of the high current, at which current zero already exists as a possibility to interrupt the circuit by the test switch, shortly before reaching the peak current value, in the peak current value, or shortly after reaching the peak current value.

26. A synthetic test circuit for high-voltage alternating-current circuit-breakers, comprising:

a high-current circuit containing a high current source connected in series with at least one auxiliary switch and one test switch, and with a high-current oscillating circuit comprising a high-voltage source to be connected parallel to the test switch before the current zero of the high current, at which already an interruption possibility exists, and conducting an oscillating current, wherein a open current circuit, comprising a voltage-conducting capacitance chargeable with voltage connected in series with at least one current-limiting resistor, is connected parallel to the auxiliary switch, and the current circuit is closed by means of a switching mechanism device before a current zero of the high current with interrupting possibility by the test switch, whereupon a current of relatively smaller amplitude and opposite polarity is superimposed to the high current in the auxiliary switch, wherein the superimposed current is interrupted by the same or by another switching mechanism before or at the time of the current zero of the high current, and wherein a capacitance conducting voltage and connection in series with at least one ohmic resistor is connected in parallel to the auxiliary switch before the last current zero of the high current through a controlled triggerable spark gap, whereupon an aperiodic current of relatively smaller amplitude with opposite polarity is superimposed to the high current, and the superimposed current is interrupted by a switch in a current zero before or a the time of the current zero of the high current.

27. The test circuit of claim 26, wherein:

the auxiliary switch is triggered in time so that the contacts thereof separate, within the time interval of a partial oscillation of the high current, at which current zero already exists as a possibility to interrupt the circuit by the test switch, shortly before reaching the peak current value, in the peak current value, or shortly after reaching the peak current value.

* * * * *